(12) United States Patent  (10) Patent No.: US 8,227,700 B2
Kim                        (45) Date of Patent:     Jul. 24, 2012

(54) CHIP HAVING SIDE PROTECTION TERMINAL AND PACKAGE USING THE CHIP

(75) Inventor: Dong-Joon Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 272 days.

(21) Appl. No.: 12/416,298

(22) Filed: Apr. 1, 2009

(65) Prior Publication Data
US 2009/0308641 A1    Dec. 17, 2009

(51) Int. Cl.
*H05K 1/03* (2006.01)

(52) U.S. Cl. ........ 174/255; 361/704; 361/764; 257/433; 257/528; 257/666; 438/109; 438/460; 438/462

(58) Field of Classification Search .......... 174/255; 361/704, 764; 257/433, 666, 528; 438/462, 438/109, 460
See application file for complete search history.

(56) References Cited

U.S. PATENT DOCUMENTS

| | | | |
|---|---|---|---|
| 5,502,667 A * | 3/1996 | Bertin et al. ................ 365/51 |
| 5,517,754 A * | 5/1996 | Beilstein et al. ............. 29/840 |
| 5,533,664 A * | 7/1996 | Sasaki et al. ............ 228/180.1 |
| 5,606,198 A * | 2/1997 | Ono et al. ................. 257/666 |
| 5,614,277 A * | 3/1997 | Beilstein et al. ........... 428/40.1 |
| 5,742,477 A * | 4/1998 | Baba ........................ 361/704 |
| 6,081,023 A * | 6/2000 | Murakami et al. .......... 257/666 |
| 6,232,655 B1 * | 5/2001 | Sugimura ................... 257/690 |
| 6,388,333 B1 * | 5/2002 | Taniguchi et al. .......... 257/777 |
| 7,109,062 B2 * | 9/2006 | Okigawa .................... 438/118 |
| 7,208,343 B2 * | 4/2007 | Song et al. ................. 438/106 |
| 2002/0020915 A1 * | 2/2002 | Fujio et al. ................. 257/724 |
| 2002/0074643 A1 * | 6/2002 | Yamazaki et al. .......... 257/692 |
| 2002/0149075 A1 * | 10/2002 | Iizima et al. ............... 257/433 |
| 2003/0092219 A1 * | 5/2003 | Ohuchi et al. .............. 438/110 |
| 2005/0101056 A1 * | 5/2005 | Song et al. ................. 438/109 |
| 2006/0046436 A1 * | 3/2006 | Ohuchi et al. .............. 438/460 |
| 2009/0140947 A1 * | 6/2009 | Sasagawa et al. ........... 343/845 |
| 2009/0154124 A1 * | 6/2009 | Ligander ................... 361/764 |

FOREIGN PATENT DOCUMENTS

| | | |
|---|---|---|
| JP | 60-241228 | 11/1985 |
| JP | 2006-286920 | 10/2006 |
| KR | 1020060134393 | 12/2006 |
| KR | 1020070037939 | 4/2007 |

* cited by examiner

*Primary Examiner* — Xiaoliang Chen (74) *Attorney, Agent, or Firm* — F. Chau & Associates, LLC (57) ABSTRACT

A chip includes a chip body having an upper surface on which an active surface is formed, and at least one side protrusion terminal protruding from a lateral surface of the chip body and electrically connected to the active surface. As a plurality of semiconductor chips or parts may be connected to one another on a single package, a one-chip or one-package of a package is possible and the thickness of the package can be reduced.

7 Claims, 7 Drawing Sheets

FIG. 14

US 8,227,700 B2

CHIP HAVING SIDE PROTECTION TERMINAL AND PACKAGE USING THE CHIP

CROSS-REFERENCE TO RELATED APPLICATIONS

This application claims the benefit of Korean Patent Application No. 10-2008-0055833, filed on Jun. 13, 2008 the disclosure of which is hereby incorporated by reference herein in its entirety.

BACKGROUND

1. Technical field

The present disclosure relates to a chip having a side protrusion terminal and a package using the chip, and more particularly, to a chip having a side protrusion terminal which can connect a plurality of semiconductor chips or parts to one another in a single package so as to facilitate the production of a one-chip package or one package and reduce the thickness of a package, and a package using the chip.

2. Description of Related Art

In general, a plurality of semiconductor chips are formed on a wafer in a semiconductor manufacturing process. The semiconductor chips are then separated from the wafer in a sawing process. Each semiconductor chip is manufactured into a semiconductor package in a package process. The semiconductor package has a structure which typically includes a chip having a plurality of solder balls formed on a lower surface thereof and a circuit board electrically connected to the solder balls of the chip. Accordingly, the overall thickness of a conventional semiconductor package may include the thickness of the chip, the thickness of the circuit board, and the thickness of the solder balls.

However, in the conventional semiconductor package, as a direct connection between the chips may not be possible, a separate conductive pattern may be formed on the circuit board to electrically connect the chips.

SUMMARY OF THE INVENTION

Exemplary embodiments of the present invention may provide a chip having a side protrusion terminal in which a plurality of solder balls are formed on the lateral surface of the chip so that the overall thickness of a package can be reduced, a chip accommodation portion is formed in a circuit board so that the overall thickness of the package can be further reduced and a direct connection between the chips is possible so that a plurality of semiconductor chips or parts can be connected to one another in a single package. Consequently, as a result, making a one-chip package or one package is possible, and a ground function may be improved so that the chip and the circuit board can be firmly connected to each other using a bridge.

Exemplary embodiments of the present invention may provide a package using the above chip.

In accordance with an exemplary embodiment of the present invention, a chip is provided. The chip includes a chip body having an upper surface on which an active surface is formed, and at least one side protrusion terminal protruding from a lateral surface of the chip body and electrically connected to the active surface.

The side protrusion terminal may be a solder ball.

A ground plane may be installed on a lower surface of the chip body.

The side protrusion terminal may be provided in a plural number and arranged on a lateral surface of the chip body in at least one row.

The side protrusion terminal may be provided in a plural number and arranged on a lateral surface of the chip body in a zigzag formation.

The side protrusion terminal may comprise a chip corresponding protrusion terminal formed to correspond to a side protrusion terminal of other chip to contact the side protrusion terminal of the other chip, and a circuit board corresponding protrusion terminal formed to correspond to a bridge protrusion terminal of a circuit board to contact the bridge protrusion terminal of the circuit board.

The side protrusion terminal may be electrically connected to the active surface via an embedded type conductive pattern or an exposure type conductive pattern.

In accordance with an exemplary embodiment of the present invention, a package using a chip having a side protrusion terminal is provided. The package includes a chip which comprises a chip body having an upper surface on which an active surface is formed, and at least one side protrusion terminal protruding from a lateral surface of the chip body and electrically connected to the active surface. The package further includes a circuit board contacting and electrically connected to the side protrusion terminal of the chip.

The package may further comprise a bridge installed between the side protrusion terminal of the chip and the circuit board.

The bridge may comprise at least one bridge protrusion terminal corresponding to the side protrusion terminal of the chip, at least one bridge pin corresponding to the conductive pattern of the circuit board, and a bridge body supporting the bridge protrusion terminal and the bridge pin.

The bridge protrusion terminal may have an engaging portion that is forcibly coupled to the side protrusion terminal of the chip.

The bridge pin may be formed of elastic material.

The bridge pin may have a bent portion.

A chip accommodation portion accommodating the chip may be formed in the circuit board.

The circuit board may comprise a penetrated substrate layer in which a through window is formed to form the chip accommodation portion.

The circuit board may comprise a ground substrate layer contacting and electrically connected to a ground plane formed on a lower surface of the chip and supporting the chip.

BRIEF DESCRIPTION OF THE DRAWINGS

Exemplary embodiments of the present invention can be understood in more detail from the following detailed description taken in conjunction with the accompanying drawings in which.

DETAILED DESCRIPTION OF THE EXEMPLARY EMBODIMENTS OF THE INVENTION

The attached drawings for illustrating exemplary embodiments of the present invention are referred to for gaining a sufficient understanding of the inventive concept, the merits thereof, and the objectives accomplished by the implementation of exemplary embodiments of the present invention. Hereinafter, exemplary embodiments of the present invention will be explained with reference to the attached drawings. Like reference numerals in the drawings denote like elements.

Figure 1:
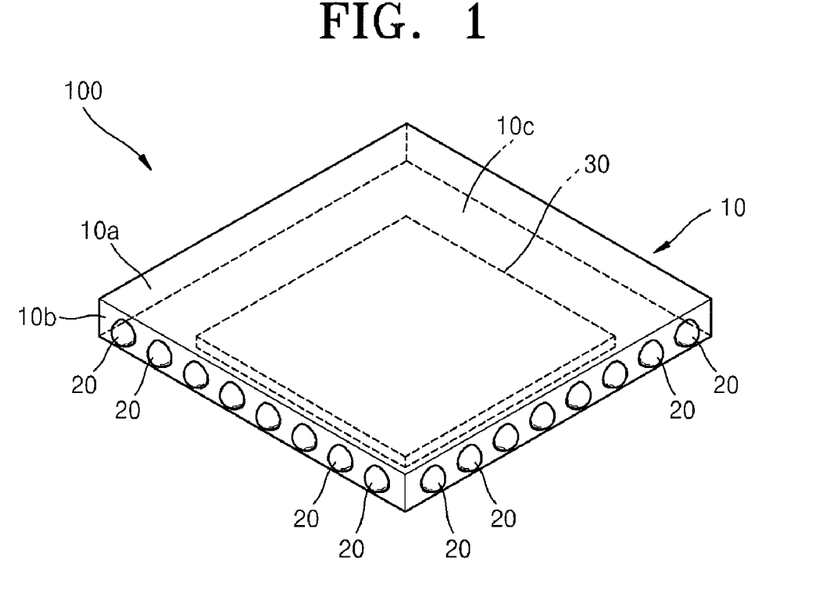
FIG. 1 is a perspective view of a chip having a side protrusion terminal according to an exemplary embodiment of the present invention.
Figure 2:
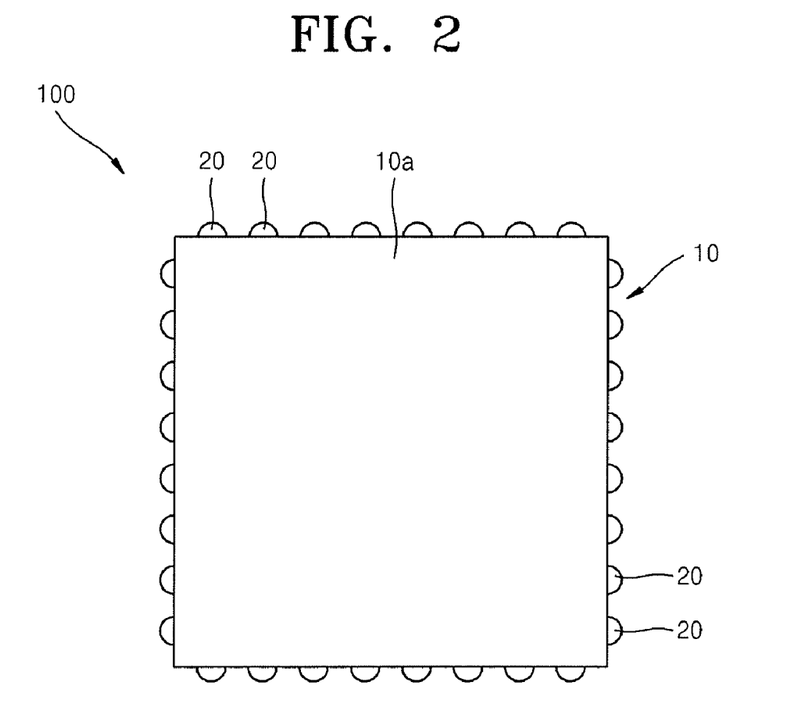
FIG. 2 is a plan view of FIG. 1.
Figure 3:
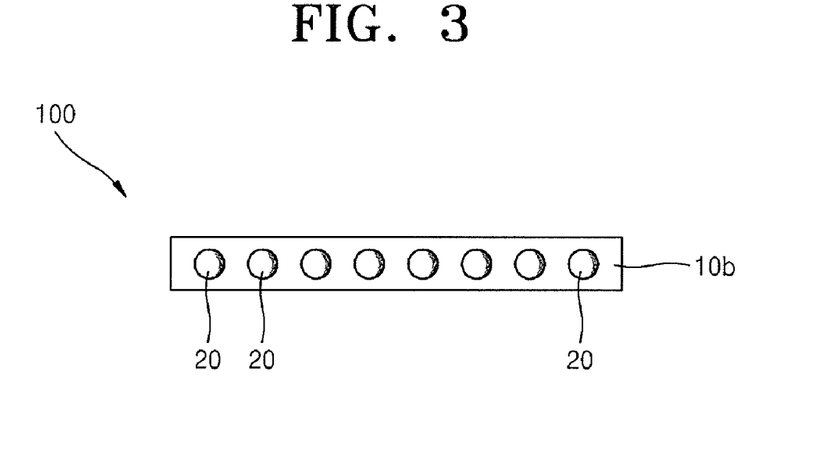
FIG. 3 is a side view of FIG. 1.
Figure 6:
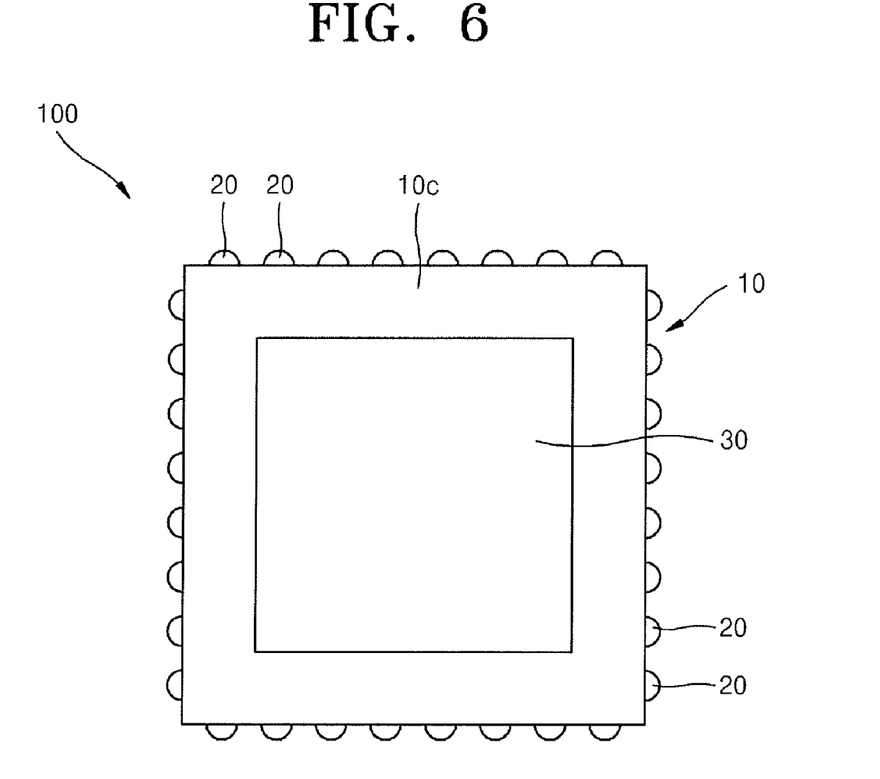
FIG. 6 is a bottom view of FIG. 1.

FIG. 1 is a perspective view of a chip having a side protrusion terminal according to an exemplary embodiment of the present invention. FIG. 2 is a plan view of FIG. 1. FIG. 3 is a side view of FIG. 1. FIG. 6 is a bottom view of FIG. 1.

As shown in FIGS. 1, 2, 3, and 6, a chip 100 having a side protrusion terminal according to an exemplary embodiment of the present invention includes a chip body 10 and a side protrusion terminal 20. The chip body 10 may be, for example, a thin hexahedron having one upper surface 10a, four lateral surfaces 10b, and one lower surface 10c. Also, an active surface where a variety of conductive patterns are formed may be formed, for example, on the upper surface 10a of the chip body 10. For example, the side protrusion terminal 20 according to the present exemplary embodiment is electrically connected to the active surface and may protrude from at least one of the lateral surfaces 10b of the chip body 10. The side protrusion terminal 20 may be, for example, a hemispheric solder ball. However, the solder ball may have any shapes in addition to the hemispheric shape.

A ground plane 30 for improving a ground function may be installed on the lower surface 10c of the chip body 10. As it may be beneficial to a ground function that the ground plane 30 occupies a larger area, the ground plane 30 may be electrically connected to a ground substrate layer 43 of a package using the chip 100 having a side protrusion terminal of the present exemplary embodiment which will be described later with respect to FIG. 9.

Figure 4:
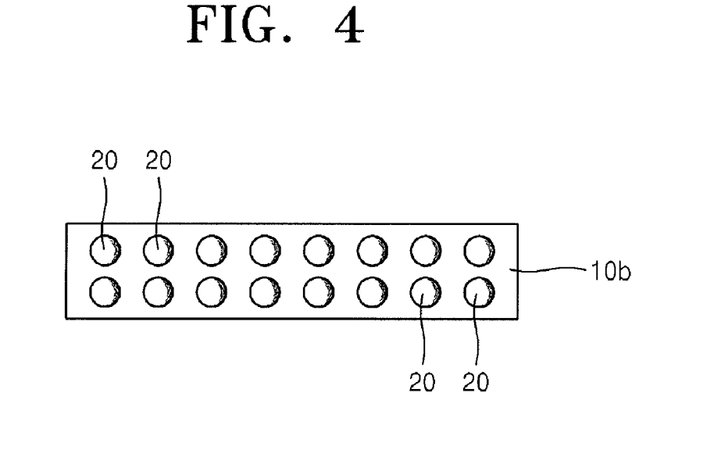
FIG. 4 is a side view of FIG. 3 according to an exemplary embodiment of the present invention.

FIG. 4 is a side view of FIG. 3 according to another exemplary embodiment of the present invention. Referring to FIG. 4, the side protrusion terminal 20 is provided in a plural number on one of the lateral surfaces 10b in at least one row, for example, two rows as shown in FIG. 4.

Figure 5:
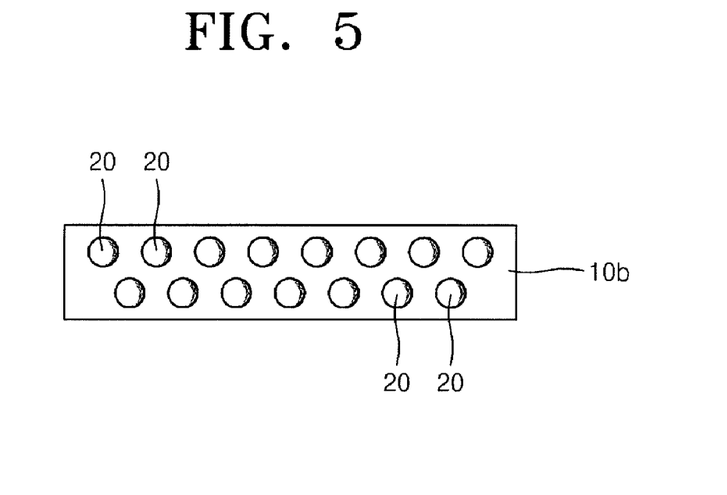
FIG. 5 is a side view of FIG. 3 according to an exemplary embodiment of the present invention.

FIG. 5 is a side view of FIG. 3 according to another exemplary embodiment of the present invention. Referring to FIG. 5, the side protrusion terminal 20 is provided in a plural number on one of the lateral surfaces 10b in a zigzag formation. In addition, the side protrusion terminal 20 may be arranged in a variety of manners, for example, in a multiple rows or only at a particular position.

Figure 7:
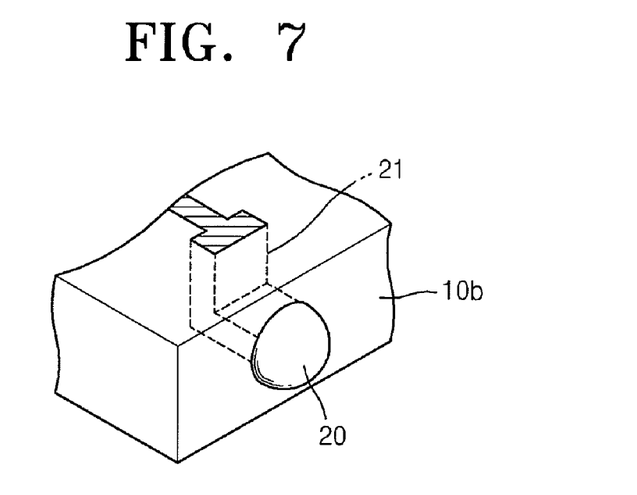
FIG. 7 is an enlarged perspective view of an example of a conductive pattern of FIG. 1.

FIG. 7 is an enlarged perspective view of an example of a conductive pattern of FIG. 1. Referring to FIG. 7, the side protrusion terminal 20 may be electrically connected to the active surface 10a via, for example, an embedded type conductive pattern 21. The embedded type conductive pattern 21 may be formed through various pattern forming processes such as, for example, etching, ion implantation, diffusion, oxide film formation, and plating.

Figure 8:
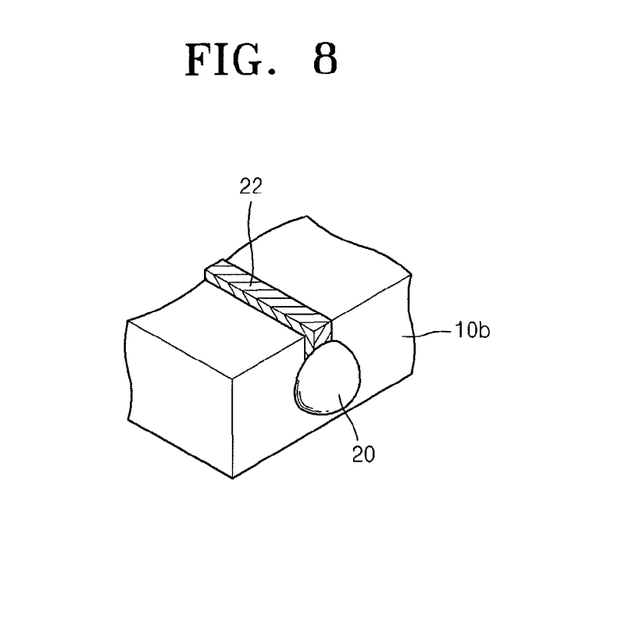
FIG. 8 is an enlarged perspective view of another example of the conductive pattern of FIG. 1.

FIG. 8 is an enlarged perspective view of another example of the conductive pattern of FIG. 1. Referring to FIG. 8, the side protrusion terminal 20 may be electrically connected to the active surface 10a via, for example, an exposure type conductive pattern 22. The exposure type conductive pattern 22 may be formed through various pattern forming processes such as, for example, wiring, conductive body adhesion, conductive body welding, and print circuit process, in addition to the above processes such as, for example, etching, ion implantation, diffusion, oxide film formation, and plating. Thus, as the thickness of the chip 100 having the side protrusion terminal of the present exemplary embodiment is the same as that of the chip body 10, there may be an increase in the thickness due to the existence of the side protrusion terminal 20 so that the thickness of the chip 100 can be minimized.

Figure 9:
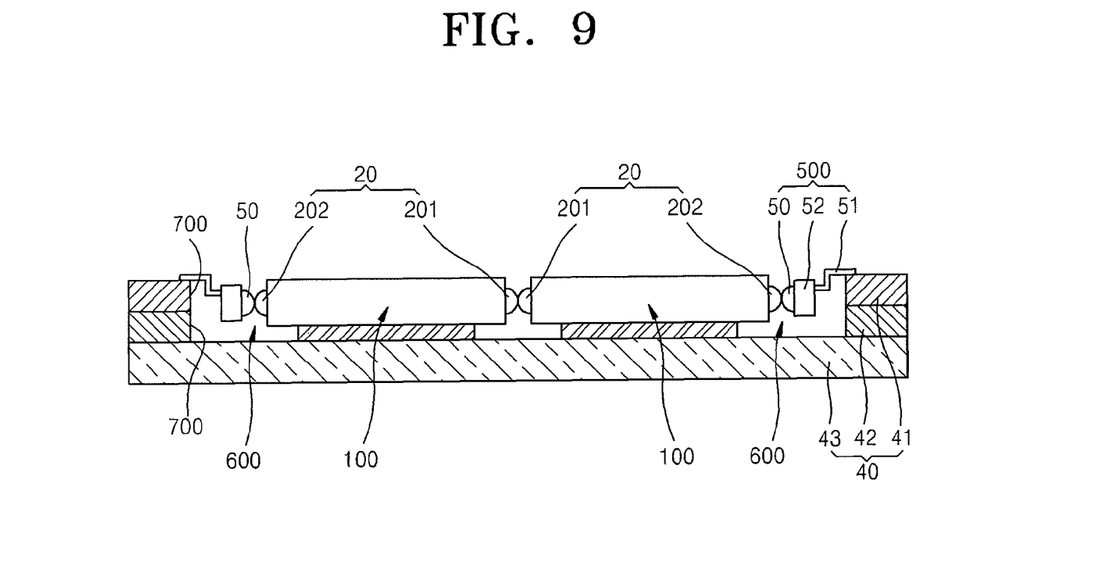
FIG. 9 is a cross-sectional view of a package using the chip having a side protrusion terminal according to an exemplary embodiment of the present invention.
Figure 14:
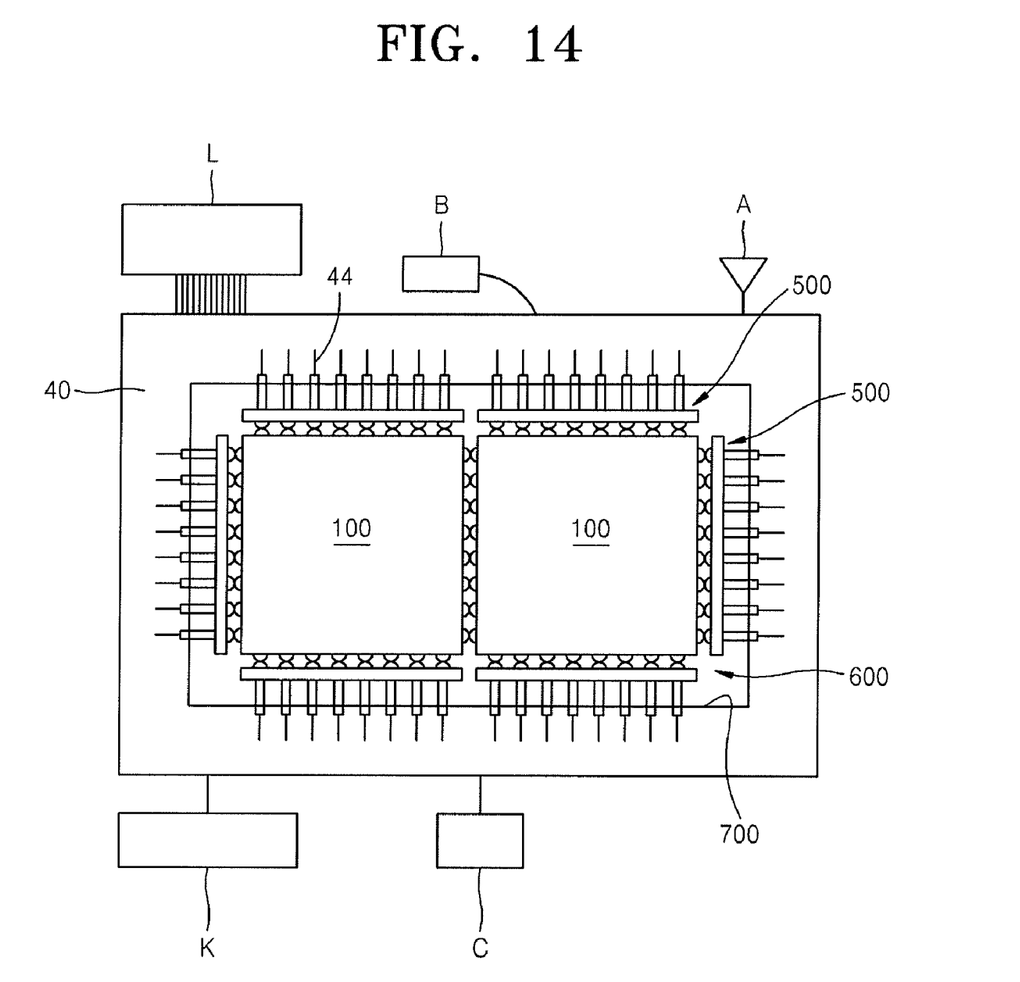
FIG. 14 is a plan view showing a state of the use of a package using the chip having a side protrusion terminal of FIG. 9.

FIG. 9 is a cross-sectional view of a package using the chip having a side protrusion terminal according to an exemplary embodiment of the present invention. FIG. 14 is a plan view showing a state of the use of a package using the chip having a side protrusion terminal of FIG. 9. Referring to FIGS. 9 and 14, the side protrusion terminal 20 of the chip 100 according to the present exemplary embodiment may consist of a chip corresponding protrusion terminal 201 and a circuit board corresponding protrusion terminal 202. That is, the chip corresponding protrusion terminal 201 corresponds to the chip corresponding protrusion terminal 201 of another chip. The circuit board corresponding protrusion terminal 202 corresponds to a bridge protrusion terminal 50 of a circuit board 40.

Thus, in the chip 100 having the side protrusion terminal of the present embodiment, the chip corresponding protrusion terminal 201 enables the direct connection of chip to chip so that a variety of types of chips or parts can be made as one chip (or one package) in a single package.

As shown in FIGS. 9 and 14, a package using the chip 100 having a side protrusion terminal according to an exemplary embodiment of the present invention includes a chip 100, a circuit board 40, and a bridge 500. The chip 100 includes the chip body 10 having the upper surface on which the active surface 10a is formed and the side protrusion terminal 20 electrically connected to the active surface 10a and protruding from the lateral surface 10b of the chip body 10. The circuit board 40 contacts the side protrusion terminal 20 of the chip 100 and is electrically connected thereto. Also, the bridge 500 is installed between the side protrusion terminal 20 of the chip 100 and the circuit board 40.

Figure 10:
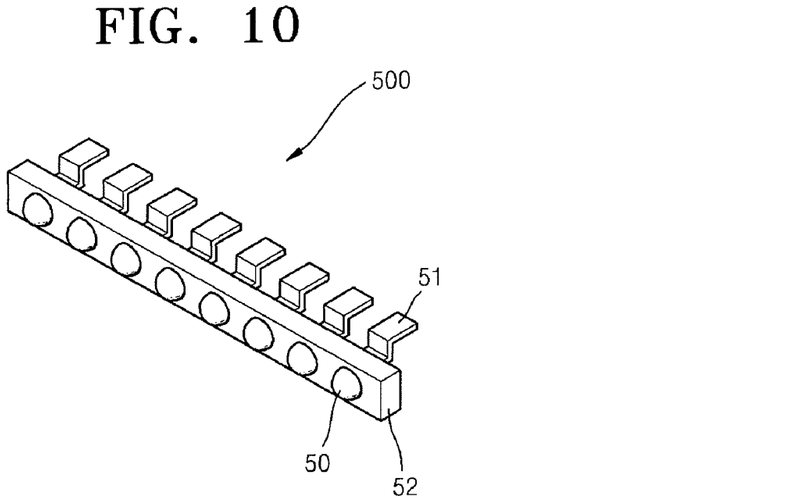
FIG. 10 is a perspective view of the bridge of FIG. 9.
Figure 11:
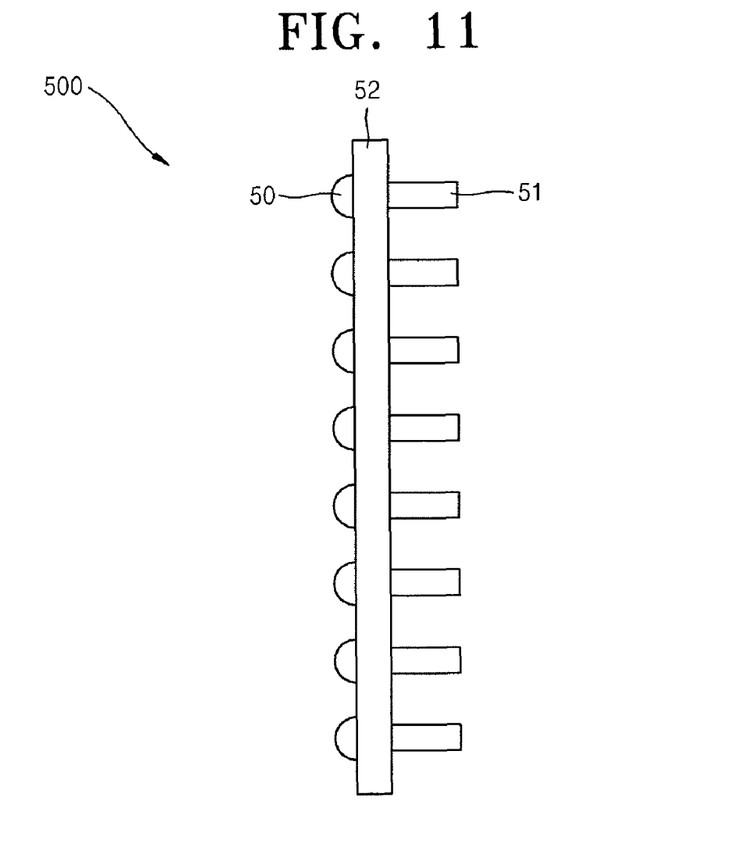
FIG. 11 is a plan view of FIG. 10.
Figure 12:
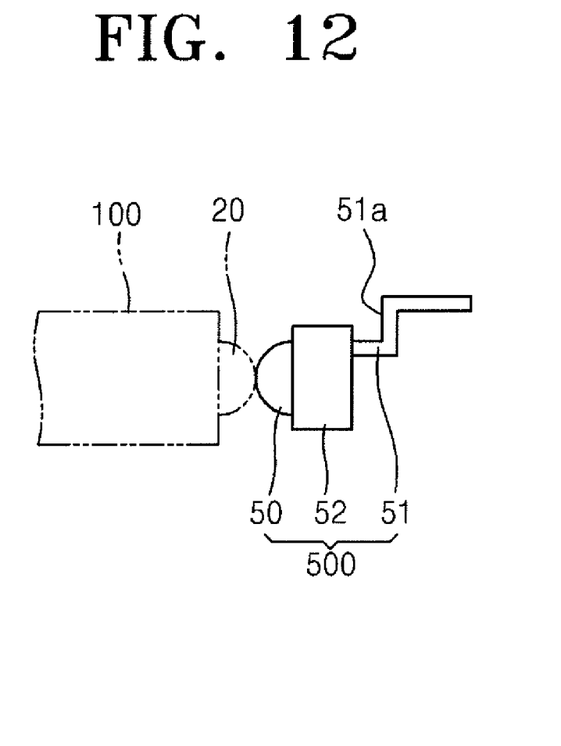
FIG. 12 is a side view of FIG. 10.

FIG. 10 is a perspective view of the bridge of FIG. 9. FIG. 11 is a plan view of FIG. 10. FIG. 12 is a side view of FIG. 10. Referring to FIGS. 10-12, the bridge 500 includes a bridge protrusion terminal 50, a bridge pin 51, and a bridge body 52. The bridge protrusion terminal 50 corresponds to the protrusion terminal 20 of the chip 100 and the solder may be applied thereto. Also the bridge pin 51 corresponds to the conductive pattern 44 of the circuit board 40 of FIG. 14 and is formed of an elastic material and has a bent portion 51a. Also, the bridge body 52 supports the bridge protrusion terminal 50 and the bridge pin 51.

Thus, as shown in FIG. 12, when contacting the side protrusion terminal 20 of the chip 100, the bridge protrusion terminal 50 is pressed by an elastic restoration force in a direction toward the side protrusion terminal 20 so that a contact force can be improved.

Figure 13:
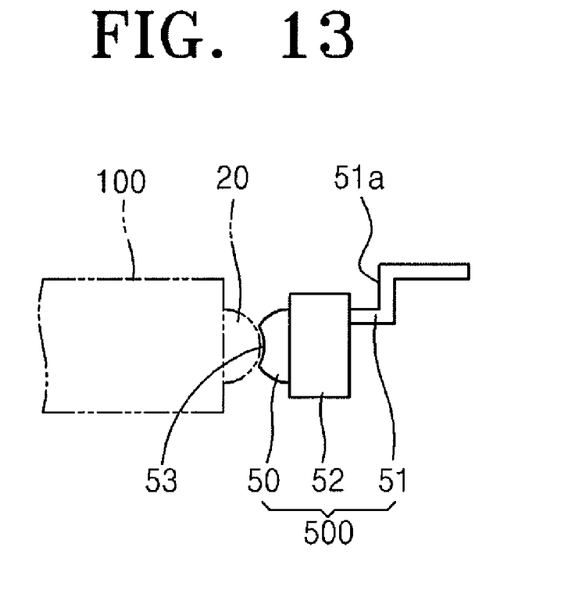
FIG. 13 is a side view of another example of FIG. 12.

FIG. 13 is a side view of another example of FIG. 12. Referring to FIG. 13, the bridge protrusion terminal 50 may have an engaging portion 53 so that the bridge protrusion terminal 50 can forcibly coupled to the side protrusion terminal 20 of the chip 100. Accordingly, as shown in FIG. 13, the side protrusion terminal 20 of the chip 100 is forcibly and firmly coupled to the engaging portion 53 of the bridge protrusion terminal 50 so that a contact force can be further be improved.

Although in the present exemplary embodiment the engaging portion 53 has a round concave shape, a variety of uneven shapes may be employed. Also, in addition to the solder ball, a variety of terminals formed of various pins or plate members can be employed as the bridge protrusion terminal 50.

Referring to FIGS. 9 and 14, the circuit board 40 is formed of a chip accommodation portion 600 for accommodating the chip 100. That is, the circuit board 40 includes penetrated substrate layers 41 and 42 and a ground substrate layer 43. The ground substrate layer 43, as shown in FIG. 9, contacts and is electrically connected to the ground plane 30 formed on the lower surface of the chip 100 and supports the chip 100.

At least one of the penetrated substrate layers 41 and 42 are deposited on and above the ground substrate layer 43 and a through window 700 is formed in which the chip accommodation portion 600 is formed. Accordingly, the chip 100 is inserted in the chip accommodation portion 600 so that the overall thickness of a package can be minimized. Also, as shown in FIG. 14, various parts such as, for example, an LCD L, a battery B, a keypad K, a camera C, and an antenna A can be connected to a single package of exemplary embodiments of the present invention so that a one-chip package or one package can be achieved. Thus, by using the chip 100 having a side protrusion terminal according to exemplary embodiments of the present invention and the package using the chip 100, not only the volume of a product but also costs can be reduced.

Having described the exemplary embodiments of the present invention, it is further noted that various modifications can be made herein without departing from the spirit and scope of the invention as defined by the metes and bounds of the appended claims.

What is claimed is:

1. A package using a chip having a side protrusion terminal, the package comprising:
   a chip which comprises a chip body having an upper surface on which an active surface is formed, and at least one side protrusion terminal protruding from a lateral surface of the chip body and electrically connected to the active surface, wherein the at least one side protrusion terminal comprises a plurality of solder ball protrusions arranged in two rows on the lateral surface of the chip body; and
   a circuit board contacting and electrically connected to the at least one side protrusion terminal of the chip, wherein the circuit board comprises a ground substrate layer contacting and electrically connected to a ground plane formed on a lower surface of the chip and supporting the chip, a first penetrated substrate layer formed directly on a top surface of the ground substrate layer and a second penetrated substrate layer formed directly on a top surface of the first penetrated substrate layer, and wherein a through window is formed in the first penetrated substrate layer and the second penetrated substrate layer of the circuit board to form a chip accommodation portion in the circuit board.

2. The package of claim 1, further comprising a bridge installed between the at least one side protrusion terminal of the chip and the circuit board.

3. The package of claim 2, wherein the bridge comprises:
   at least one bridge protrusion terminal corresponding to the at least one side protrusion terminal of the chip;
   at least one bridge pin corresponding to the conductive pattern of the circuit board; and
   a bridge body supporting the at least one bridge protrusion terminal and the at least one bridge pin.

4. The package of claim 3, wherein the at least one bridge protrusion terminal has an engaging portion that is forcibly coupled to the at least one side protrusion terminal of the chip.

5. The package of claim 3, wherein the at least one bridge pin is formed of elastic material.

6. The package of claim 3, wherein the at least one bridge pin has a bent portion.

7. The package of claim 1, wherein the plurality of solder ball protrusions are arranged in a zig-zag formation in the two rows on the lateral surface of the chip body.

* * * * *